United States Patent [19]

Branca et al.

[11] Patent Number: 5,814,405
[45] Date of Patent: Sep. 29, 1998

[54] STRONG, AIR PERMEABLE MEMBRANES OF POLYTETRAFLUOROETHYLENE

[75] Inventors: Phillip A. Branca, Hockessin, Del.; Daniel E. Hubis, Elkton, Md.; Wolfgang Buerger, Munich, Germany; Christiane Rudolf, Erding, Germany; Ralf Tillmanns, Pleinfeld-Ramsberg, Germany

[73] Assignees: W. L. Gore & Associates, Inc., Newark, Del.; W. L. Gore & Associates, GmbH, Putzbrunn, Germany

[21] Appl. No.: 690,924

[22] Filed: Aug. 1, 1996

[30] Foreign Application Priority Data

Dec. 1, 1995 [DE] Germany ............. 195 44 912.6

[51] Int. Cl.⁶ .................. B29C 55/02; B32B 5/26; D04H 13/00
[52] U.S. Cl. ............. 428/311.51; 264/127; 264/210.7; 264/288.8; 428/315.5
[58] Field of Search ............... 264/127, 210.7, 264/288.8; 428/311.51, 315.5

[56] References Cited

U.S. PATENT DOCUMENTS

| | | |
|---|---|---|
| 3,953,566 | 4/1976 | Gore . |
| 4,082,893 | 4/1978 | Okita . |
| 4,104,394 | 8/1978 | Okita . |
| 4,110,392 | 8/1978 | Yamazaki . |
| 4,187,390 | 2/1980 | Gore . |
| 4,596,837 | 6/1986 | Yamamoto et al. . |
| 4,598,011 | 7/1986 | Bowman ............... 428/221 |
| 4,671,754 | 6/1987 | Okita et al. . |
| 4,714,748 | 12/1987 | Hoashi et al. . |
| 4,760,102 | 7/1988 | Moriyama et al. . |
| 4,902,423 | 2/1990 | Bacino . |
| 4,949,284 | 8/1990 | Watanabe . |
| 5,098,625 | 3/1992 | Huang et al. . |
| 5,167,890 | 12/1992 | Sasshofer et al. . |
| 5,217,666 | 6/1993 | Tamaru et al. . |
| 5,225,131 | 7/1993 | Tamaru et al. . |
| 5,234,739 | 8/1993 | Tamaru et al. . |
| 5,234,751 | 8/1993 | Harada et al. . |
| 5,474,824 | 12/1995 | Martakos et al. ............. 428/36.9 |
| 5,552,100 | 9/1996 | Shannon et al. . |

FOREIGN PATENT DOCUMENTS

| | | |
|---|---|---|
| 0267719 | 5/1988 | European Pat. Off. . |
| 0313263 | 4/1989 | European Pat. Off. . |
| 0463106 | 2/1994 | European Pat. Off. . |
| 0707033 | 4/1996 | European Pat. Off. . |
| 64-78823 | 3/1989 | Japan . |
| 3-221541 | 9/1991 | Japan . |
| 6-256549 | 9/1994 | Japan . |
| 2025835 | 1/1980 | United Kingdom . |
| 9222604 | 12/1992 | WIPO . |
| 9318214 | 9/1993 | WIPO . |

*Primary Examiner*—James C. Cannon
*Attorney, Agent, or Firm*—Gary A. Samuels

[57] ABSTRACT

Microporous membranes are described and characterized as having a morphological microstructure of very highly elongated nodes interconnected by fibrils which form a structural network of voids or pores through the spaces between the nodes and fibrils, which voids or pores extend from one side of the membrane to the other. The membranes are highly uniform in terms of mass per volume, have very high strength and a very open microstructure.

16 Claims, 7 Drawing Sheets

STRONG, AIR PERMEABLE MEMBRANES OF POLYTETRAFLUOROETHYLENE

CROSS-REFERENCE TO RELATED APPLICATIONS

This application is the regular application based on Provisional Application Nos. U.S.S.N. 60/001,893, filed Aug. 4, 1995, U.S.S.N. 60/003,487, filed Sept. 8, 1995 and U.S.S.N. 60/008,143, filed Oct. 31, 1995.

FIELD OF THE INVENTION

This invention relates to the field of expanded i.e., stretched, porous polytetrafluoroethylene (ePTFE) membranes having a microstructure of nodes interconnected by fibrils. More specifically, it is directed to novel structures of microporous ePTFE and to a novel process for preparing the structures.

BACKGROUND OF THE INVENTION

U.S. Pat. Nos. 3,953,566 and 4,187,390 were the first U.S. patents to describe stretching of polytetrafluoroethylene (PTFE) to make microporous ePTFE. However, attempts to make highly open elongated nodal structures have been unsuccessful. In U.S. Pat. Nos. 5,234,751, 5,217,666, 5,098,625, 5,225,131, 5,167,890, 4,104,394, 5,234,739, 4,596,837, JPA 1078823 and JPA 3-221541 an extruded or shaped PTFE which is unexpanded is heated to sinter or semi-sinter the article. This sintered or semi-sintered article is then stretched to form a desired porosity and desired properties. This technique however, does not take advantage of an initial stretch below the melt of the present invention; and as a result, these teachings provide PTFE articles with small pore sizes and non-elongated nodes.

In U.S. Pat. Nos. 4,671,754, and 4,714,748 PTFE extrudates are expanded and sintered simultaneously. In these instances, the stretching is carried out uniaxially in the machine direction. There is no elongation of existing nodes and no opening up of the structure.

In GB 2,025,835A, and U.S. Pat. No. 4,760,102, a PTFE extrudate or ePTFE article is simultaneously stretched and sintered. Simultaneous sintering and stretching of an unsintered ePTFE article leads to a highly non-uniform or inconsistent product. Further breakup of nodes and formation of fibrils continues as the unsintered article is stretched. As the article is heated to the point where it becomes amorphously locked the nature of stretching changes; once amorphously locked the nodes will no longer breakup to form new fibrils. When the sintering and stretching steps are occurring simultaneously, slight variations in the temperature and heat transfer can cause large variations in final product properties. In the present invention these crucial steps are carried out as distinct, separate steps so that overall uniformity and consistency of the final product is maximized.

In U.S. Pat. No. 4,082,893 and JPA 6-256549 the heating/sintering step is conducted in such a way as to create a precursor wherein the exterior surface is very much different from the interior surface. Upon final expansion an asymmetric structure is created. In the present invention the heating/sintering step is carried out in such a way so as to fully sinter the expanded article and preserve the fibril and node structure throughout its thickness.

For special applications, PTFE can be provided with a filler material in order to modify the properties of PTFE for special applications. For example, it is known from U.S. Pat. No. 4,949,284 that a ceramic filter ($SiO_2$) and a limited amount of microglass fibers can be incorporated in a PTFE material; and in EP-B-0-463106, titanium dioxide, glass fibers, carbon black, activated carbon and the like are mentioned as filler.

SUMMARY OF THE INVENTION

The ePTFE membranes of this invention are characterized as having a morphological structure comprising a microstructure of nodes interconnected by fibrils which form a structural network of voids or pores through the spaces between the nodes and fibrils, which voids or pores extend from one side of the membrane to the other.

The structure is formed in a novel way so that the nodes are highly elongated, having an aspect ratio of greater than 25:1, preferably greater than 50:1 and more; preferably greater than 150:1. In addition, the nodes are aligned in substantially elongated parallel configurations. These aligned elongated nodes are interconnected along their length by a myriad of microfibrils. The result is a series of rib-like rows of nodes, with each row connected by a multitude of fibrils. The membranes of the invention generally have a Frazier Number between 5 and 500 and preferably above 50.

This invention also relates to a process whereby the aforementioned articles are produced in which a polytetrafluoroethylene (PTFE) fine powder resin is blended with a lubricant, formed into a cylindrical preform and paste extruded into the desired shape. This shape can be calendered between driven rolls to affect the desired thickness. Lubricant is removed from the shaped article and then the article is expanded to form microporous expanded PTFE (ePTFE) uniaxially or biaxially at a temperature below the crystalline melt temperature of the PTFE resin, or if a blend or mixture of PTFE resins is used below the crystalline melt temperature of the lowest melting resin. The expanded article is then heated to a temperature above the crystalline melt temperature of the highest melting PTFE present to amorphously lock the structure. The expanded amorphously locked article is then heated to a temperature above the crystalline melting temperature of the highest melting PTFE present and stretched in at least the direction orthogonal to the direction of the first stretch that took place below the melt temperature of the PTFE present. Articles of this invention are highly uniform, strong, have low resistance to fluid flow. Articles of this invention are particularly well suited for use in the filtration, electronic product and medical fields.

The resulting membranes can be characterized by having a unique combination of high air flow and high strength such that the product of Frazier Number and Ball Burst is at least 100. Further, the membranes of the present invention possess improved uniformity, optical clarity and handleability.

In one embodiment, the membrane can contain filler material. By appropriate choice of filler it is possible to increase various properties, for example, abrasion resistance.

DETAILED DESCRIPTION OF THE INVENTION

Figure 1A:
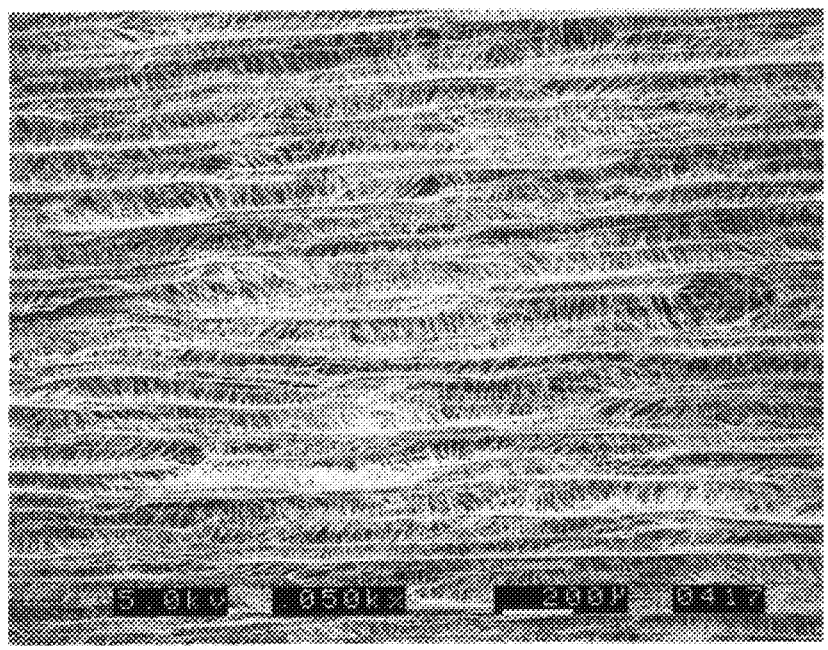
FIG. 1a and 1b depict the product of the invention produced in Example 1.

With a traditional process for producing ePTFE structures, to create tapes and membranes with low resistance to fluid flow, several techniques can be used. Changing to a lower molecular weight PTFE polymer or changing to a modified PTFE polymer gives a material which will more readily produce a coarse microstructure with fewer, larger nodes and fewer, longer fibrils.

This will produce a higher fluid flow membrane or tape but it also tends to produce tapes or membranes which are much less uniform. Altering processing parameters such as expansion rate can yield a more open ePTFE structure but with a significant decrease in overall uniformity. The total expansion ratio can be increased to yield a higher flow membrane but this reduces the mass per area of the membrane and so reduces strength and handleability.

The present invention overcomes these deficiencies and produces membranes and tapes which have good air flow, are strong, handleable and uniform. This is accomplished, as described in Gore U.S. Pat. No. 3,953,566, by first compounding a polytetrafluoroethylene (PTFE) resin which is suited to produce a node and fibril microstructure upon stretching. The resin is blended with an aliphatic hydrocarbon lubricant extrusion aid, such as a mineral spirit. The compounded resin is formed into a cylindrical pellet and paste extruded by known procedure into a desired extrudable shape, preferably a tape or membrane. The article can be calendered to the desired thickness between rolls and then thermally dried to remove the lubricant. The dried article is expanded in a first stretch in the machine and/or transverse direction according to the teachings of U.S. Pat. No. 3,953,566 to produce an expanded PTFE structure characterized by a series of nodes which are interconnected by fibrils. The ePTFE article is then amorphously locked by heating the article above the crystalline melt point of PTFE (343° C.), for example, 343 °–375° C. The amorphously locked article is then further stretched at a temperature above the crystalline melt point in at least the direction orthogonal to the direction of greatest expansion in the first stretch. If a mixture of PTFE resins are used, the temperatures employed in these steps is as set forth further above.

In another embodiment, one paste extruded tape or membrane can be layered with another paste extruded tape or membrane to produce an asymetric composite form of the invention in which the node-fibril microstructure is different on one side as opposed to the other. Lamination is achieved by preparing an extrudate of each membrane and rolling down as described further above; and then combining the two membranes into layers, followed by calendering, drying, and the stretching, sintering, and stretching again, all as described further above.

The resulting ePTFE articles are extremely uniform and possess a unique microstructure characterized as having highly elongated nodes interconnected by fibrils. The resulting articles also have a unique set of physical properties including high strength and low resistance to fluid flow. The present invention can be used to produce membranes or tapes with a wide range of physical properties. It is quite surprising that this novel type of process would produce a highly uniform continuous film, especially with the large node, i.e., coarse, microstructures which are possible.

The present invention allows the creation of open pore membranes and tapes, with low resistance to fluid flow by combining two types of stretching techniques, one before and one after amorphous locking. Initial expansion in the longitudinal direction is carried out prior to amorphous locking to set the scale of the microstructure (i.e. fibril and node dimensions). The uniformity of this expanded tape is extremely high. This highly uniform microstructure is then amorphously locked by heating above the crystalline melting point of the highest melting PTFE present. This coalesces the nodes into sections of solid polymer. This locking step helps to preserve the uniformity of that initial expansion step. In the final transverse stretching step, when the expanded tape is heated to a temperature above the crystalline melt point of the PTFE resins present, the nodes elongate while the fibrils separate. The nodes do not continue to fracture and fibrillate upon further stretching as occurs in expansions with non-amorphously locked PTFE tapes. Because no additional fibrillation takes place in this stretch step, very open, high flow, high strength membranes can be produced.

Traditional biaxial expansions of non-amorphously locked PTFE are extremely sensitive to differences in temperature and rate. Small differences in temperature or rate can lead to nonuniformities in the final membrane. Surprisingly, the stretch above the crystalline melt point of the present invention is much less sensitive to changes in temperature or rate. As a result, the membranes produced by the present invention are much more uniform than traditional expanded PTFE products. The nodes of this structure are necessarily highly elongated and oriented. Aspect ratios on these nodes are greater than about 25 or 50:1 and preferably greater than 150:1. This effectively produces a structure with solid polymer reinforced nodular ribs oriented transverse to the direction of initial expansion. These ribs prevent propagation of breaks or tears in the longitudinal direction. This has important ramifications for certain subsequent processing steps, e.g. lamination, where longitudinal propagation of breaks is a problem.

The present invention provides extremely coarse microstructures where a large percentage of the total mass is retained in the nodes. This results in a much higher mass article for a given openness or air flow thus yielding higher strength and durability. Matrix tensile strength can also be increased by increasing stretch ratio. By balancing the first and second stretch steps, a balance in strength in the x and y direction can be obtained.

The PTFE starting material can be any type of coagulated dispersion PTFE which lends itself to the formation of fibrils and nodes upon expansion. This is generally a polymer of high molecular weight.

In one preferred embodiment of the present invention extremely high flow membranes are produced which are uniform, strong and easily handled. In this embodiment, the preferred starting material is a blend of high molecular weight fine powder PTFE homopolymer and a lower molecular weight modified PTFE polymer. This material is readily processed to form uniform expanded products with large nodes and long fibrils. By combining this blend of two PTFE resins with the process of the present invention described above, a family of high flow, strong, uniform, handleable membranes can be produced. This family of membranes has in common a combination of physical properties which are not possible by any of the traditional techniques.

Thus, the PTFE starting material used in the process of the invention can be homopolymer PTFE or a blend of PTFE homopolymers. It can also be a blend of homopolymer and a PTFE copolymer in which the comonomer units are not present in amounts which cause the polymer to lose the non-melt-processible characteristics of pure homopolymer PTFE By "fine powder PTFE" is meant that PTFE prepared by the "aqueous dispersion "polymerization technique. Both terms are well-known terms in the PTFE art.

The copolymers are called "modified PTFE homopolymers" in the art. The term "modified PTFE" is used here to describe a non-melt-processible polymer which is not a PTFE homopolymer but is a copolymer in which the homopolymer has been modified by copolymerisation with a copolymerisable ethylenically unsaturated comonomer in a small amount of less than 2% preferably less than 1%, by weight of copolymer. These copolymers have been called "modified" PTFE by those skilled in the art because presence of comonomer units does not change the basic nonmelt processable character of homopolymer PTFE. Thus, the term "modified" is used to connote that the good toughness, heat resistance and high temperature stability of the homopolymer is not altered when the homopolymer chain is interrupted by smaller trace units of the comonomer. Examples of comonomers include olefins such as ethylene and propylene; halogenated olefins such as hexafluoropropylene (HFP), vinylidene fluoride and chlorofluoroethylene; or perfluoroalkyl vinyl ethers such as perflurorpropyl vinyl ether (PPVE). Preferably the comonomer is fluorinated and most preferably is HFP or PPVE. Neither PTFE homopolymer nor modified PTFE is considered to be elastomeric.

The homopolymer can also be blended with low molecular weight PTFE known as micropowders, which are made by irradiation of high molecular weight PTFE, or are made by special TFE polymerization. The homopolymer can also be blended with melt-processable TFE copolymers such as FEP or PFA (hexafluoropropylene/tetrafluoroethylene copolymers or perfluoroalkyl vinyl ether/tetrafluoroethylene copolymer). Blends of two or more PTFE polymers can be used, as can blends of PTFE with other fluoropolymers. No particular preference is made over the ratios of ingredients of these blends. One ingredient can be 5% or 95%, by either weight or volume.

In another embodiment even greater openness of structure can be achieved without sacrificing uniformity or handleability by carrying out an additional longitudinal stretch after amorphous locking but prior to the final transverse stretch. The first post amorphous locking stretch in the longitudinal direction does little to further break up nodes but does elongate existing fibrils and separate existing nodes. By adding this stretching step nodes are separated and fibrils lengthened. The structure thus created has a significantly larger average effective pore size. This added step does not reduce the overall uniformity of the final article. Adding this step greatly increases the total post amorphous locking stretch ratio possible with a given precursor. Typical constructions can be stretched to ratios between 9:1 and 12:1 in the transverse direction above 327° C. With the post locking longitudinal stretch, total stretch ratios after amorphous locking of 24:1 and greater can be achieved. With a given precursor, Frazier number values have been increased by a factor of 25 while ball burst values decreased by a factor of only 3 when a 4:1 longitudinal stretch after amorphous locking was added.

Thus, in this invention, membranes with unique properties or combinations of poperties can be produced. Some of these attributes are listed following:

Microstructure

Membranes of this invention have a microstructure which can be characterized as having highly elongated nodes with aspect ratios greater than 25 or 50, preferably greater than 150.

Node shape and orientation can be designed to prevent notch propagation.

Uniformity, Handleability

Membranes of this invention are extremely uniform in mass per area, thickness and resistance to fluid flow.

Finished membrane properties are insensitive to small changes in temperature during the final stretching operation.

Uniformity as determined by the coefficient of variability of mass per area is less than 11% and preferably less than 8%.

Membranes with extremely high air flow values (>200F) can be made which are easily handled and further processed.

High Air Flow/High Strength

Membranes of this invention are characterized as having a unique combination of high air flow and high burst strength. This relationship is shown by the fact that membranes of this invention can have Frazier number air flow values and Ball Burst strength values such that the product of these two values is greater than 60, and preferably greater than 100.

The membranes of the invention are useful as filters in filtration devices, as scaffolding for holding reactive or conductive fillers, or as support layers in composite constructions.

The membrane can contain filler material, such as carbon black or other conductive filler, catalytic particulate, thermal stability type particulate, and the like. In one embodiment, the ePTFE structures of the present invention comprises the stretched polytetrafluoroethylene (ePTFE) with a filler of particles in the nanometer size range. These filler particles have a size from 5 to 500 nm, preferably from 10 to 300 nm. They will be referred to for short as "nanoparticles."

A number of properties can be enhanced depending on the filler material used. For example, a significant increase in water flow rate can be achieved by incorporating hydrophilic nanoparticles in the structure. This enhances use of the membranes of the invention in aqueous filtration. In addition, nanosize ceramic particulate in the filled membranes makes them useful in dialysis cells.

Inorganic fillers, especially oxides and mixed oxides can be used, e.g., oxides of Group 2A, Group 4, as fillers, including those oxides and mixed oxides whose surface is chemically modified. For example, ferromagnetic properties can be achieved with fillers of this type. Materials of this type can be used to shield electrical cables or in circuit boards. Preferred examples of ceramic fillers include $Al_2O_3$ and $TiO_2$. Other types of useful fillers include, for example, of carbon (graphite) or of metals.

The mixing of nanosize particles of filler in the PTFE resins occurs prior to addition of lubricant. The mixing can occur in general in three different ways, namely by dispersion mixing, dry mixing, or co-coagulation.

Dry mixing of PTFE and filler nanoparticles is preferred when the particle size of the PTFE material, on the one hand, and that of the filler, on the other, are identical, no agglomeration of the components is observed, and homogenization of the components is achieved by dry mixing.

On the other hand, a filler dispersion can be first produced by slowly introducing an oxide, e.g., $TiO_2$, into a lubricant, e.g., Shellsol® product, to which a limited amount of lauric acid is added. PTFE powder is next introduced to a mixer and the lubricated $TiO_2$ slowly metered in.

Alternatively, a PTFE powder can be mixed with powdered oxide of nanoparticle size in a mixer. The lubricant is then metered into this mixture with lauric acid dissolved in it.

In addition, an aqueous dispersion of nanoparticles can be mixed with an aqueous dispersion of PTFE, and the mixture made to coagulate by addition of an electrolyte. The water can be separated and the material dried.

The aforementioned stretching steps of the invention are then employed to obtain filled ePTFE structures.

The membranes produced by the aforementioned processes are extremely thin, permit very high gas or fluid, bulk flow rate, are much more resistant to abrasion relative to conventional membranes, and possess good filter properties.

TEST PROCEDURES

MatrixTensile Strength (mTS)

Testing was carried out on an Instron (Instron Corporation series IX-automatic material testing system 1.09) according to DIN standard 53888. Samples were 15 mm wide. Gauge length (distance between clamps) was 50 mm. Samples were pulled at a crosshead speed of 100 mm/min. At 20° C. and 65% humidity. Elongation at break and maximum load were recorded.

Moisture Vapor Transmission Rate (MVTR)

Values were obtained following the procedure set forth in U.S. Pat. No. 4,862,730 using potassium acetate as the salt and carrying out the test at 23° C. and 50% relative humidity.

Molecular Weight

Molecular weight may be determined from the formula:

$$Mwn = 0.597 \log \frac{0.157 - 1}{2.306 - SSG} \times 10^6$$

wherein SSG=the standard specific gravity of the PTFE. SSG may be calculated in accordance with ASTM standards D1457-62T and D727-60 T.

The data for the particle size of commercially available materials were taken from data sheets of the manufacturer.

Average Pore Diameter (Mean Flow Pore Size, MFP d50)

A sample membrane having a 25 mm diameter was obtained and wetted with perfluoropolyether. The wetted membrane were placed in a Coulter Porometer wherein the average pore diameter of the final product was determined.

Burst Strenqth-Ball Burst Test

This test measures the relative strength of a sample of membrane by determining the maximum load at break. A single layer of membrane is challenged with 1 inch diameter ball while being clamped and restrained in a ring of 3 inch inside diameter.

The membrane is placed taut in the ring and pressure applied against it by the steel ball of the ball burst probe. Maximum load is recorded as "Ball Burst" in pounds.

Frazier Number Air Permeability

Air permeability was measured by clamping a test sample in a circular gasketed flanged fixture 5.5 inches in diameter (23.76 square inches in area). The upstream side of the sample fixture was connected to a flow meter in line with a source of dry compressed air. The downstream side of the sample fixture was open to the atmosphere.

Testing was accomplished by applying an air pressure of 0.5 inches of water to the upstream side of the sample and recording the flow rate of air passing through the in-line flow meter (a ball-float rotameter).

Results are reported in terms of Frazier Number which has units of cubic feet/minute/square foot of sample at 0.5 inches of water pressure.

Resistance Method Air Permeability

Air permeability for very high air flow membranes was measured by clamping a test sample in a gasketed flanged 30 cm×50 cm rectangular fixture. Air flow was adjusted to 480 liters per minute which equates to a face air velocity of 3.2 meters per minute. An electronic manometer was used to measure the pressure drop value across the test sample. This pressure drop value was corrected for slight variations in air flow by normalizing to exactly 3.2 meters per minute face velocity. The corrected value was recorded as resistance in units of inches of water per 3.2 meters per minute face velocity. This resistance value was converted to a calculated Frazier Number using a correction factor and the following equation: 180/Resistance=Frazier Number.

Node Aspect Ratio

A representative sample of membrane is chosen and scanning electron micrographs are prepared of the surface of the specimen. Measurements of node length and corresponding node width are made directly from an appropriate micrograph. No fewer than five such measurements are taken of representative nodes. Aspect ratio is calculated and the values are averaged and reported as Node-Aspect Ratio.

Mass per Area

Five circles of 4.442 inch diameter (100 $cm^2$ area) are cut from a representative sample of membrane. The mass for each circle is measured on an analytical balance accurate in grams to three decimal places. Values in grams per 100 square centimeters are converted to grams per square meter by multiplying by 100. Mass per area values were averaged and reported in units of grams per square meter.

EXAMPLES

Example 1

Figure 1B:
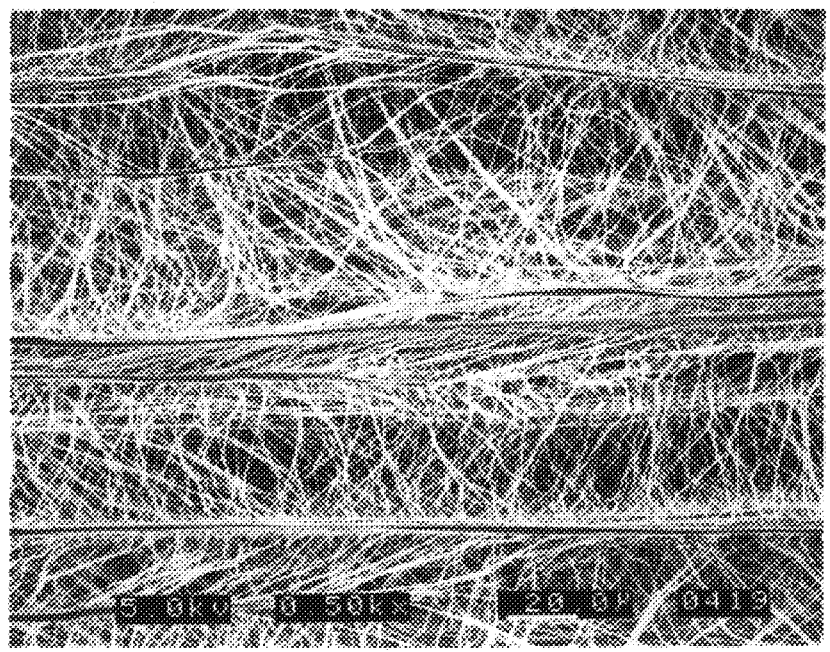

A high molecular weight PTFE homopolymer, in dispersion form was obtained from E. I. DuPont de Nemours Co., Inc. and combined with the dispersion form of CDO090 (a modified PTFE produced by ICI) in amounts such that the resins were combined in a 50/50 ratio based on solids. The modified polymer was made mostly of recurring units of tetrafluoroethylene with a very small amount of units of fluorinated comonomers. A total of 30 pounds of polymer was prepared at a solids concentration of 15%. The mixture was coagulated by agitation using a motor driven impeller. After coagulation, the blended resin was separated from the bulk water by filtration and dried in an air oven to remove any remaining water. This resin (about 30 pounds) was compounded with 23.37% aliphatic hydrocarbon (boiling range 170° C.–210° C.) by weight. A cylindrical pellet was formed and extruded through a rectangular orifice die to form a tape approximately 6 inches wide and 0.028 inch thick. This tape was calendered between rolls to give a final thickness of 0.0105 inch. The extruded, calendered tape was thermally dried to remove lubricant and then expanded in the longitudinal direction 9:1 at 300° C. This expanded tape was amorphously locked by contacting 365° C. heated rolls. The amorphously locked tape was stretched in the transverse direction to a ratio of 9.1:1 in an air heated chamber at 375° C. running at a line speed of 32.8 ft/min. Upon visual inspection, the finished membrane was continuous, had no breaks or holes, and was extremely uniform. Membrane bulk properties are given in Table 1. The SEM of FIGS. 1a and 1b depict the final product, shown at different magnifications (50× and 500×).

Example 2

Figure 2:
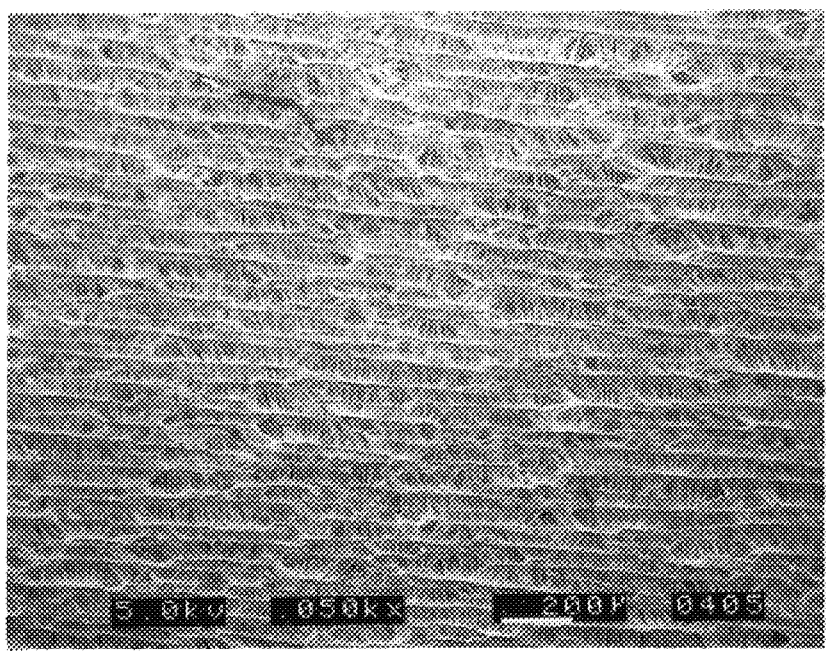
FIG. 2 depicts the product of the invention produced in Example 2.

An extruded calendered down tape prepared as in Example 1 was expanded in the longitudinal direction a total of 5.06:1 at 300° C. This tape was amorphously locked by contacting heated rolls at a temperature of 365° C. The tape was then stretched in the transverse direction a total of 4.15:1 in an air heated chamber at 375° C. running at a line speed of 32.8 ft/min. The resulting membrane was continuous with no breaks or holes and was extremely uniform. Membrane physical properties are given in Table 1. The SEM of FIG. 2 depicts the product.

Example 3

Figure 3:
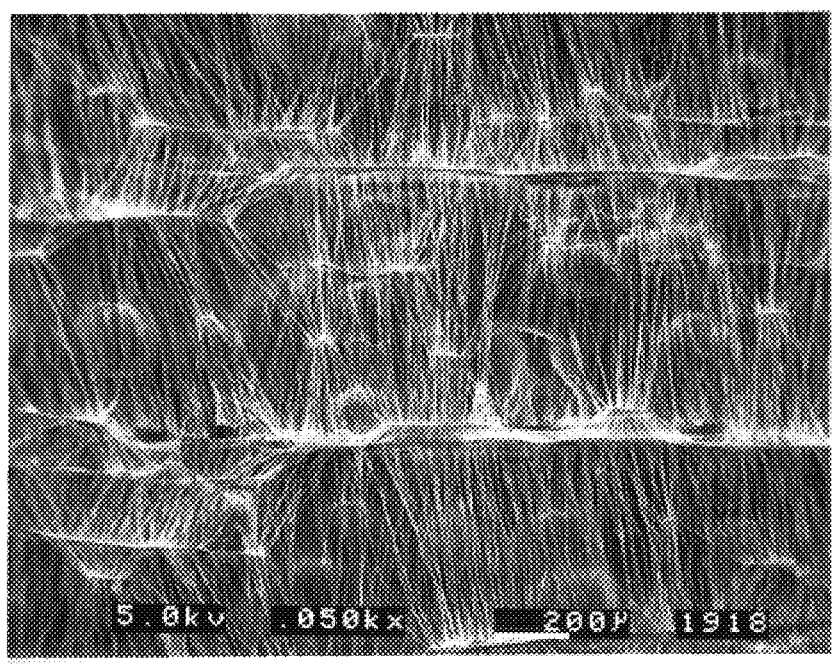
FIG. 3 depicts the product of the invention produced in Example 3.

The blended resin formulation used in Example 1 was compounded with 23.37% aliphatic hydrocarbon and formed into a cylindrical pellet. The pellet was extruded through a rectangular orifice die to give a continuous tape 12' wide and 0.030 inch thick. This tape was calendered between rollers to give a final thickness of 0.006 inch. The tape was thermally dried to remove the aliphatic hydrocarbon and then was expanded in the longitudinal direction in a heated chamber at 300° C. to a ratio of 8:1. The expanded tape was amorphously locked by heating in 360° C. air. The amorphously locked tape was further stretched in the longitudinal direction in a heated chamber at 360° C. to an additional ratio of 4:1. The tape was then stretched in a 375° C. heated chamber in the transverse direction at a line speed of 32.8 ft. per minute to a ratio of 5.6:1. The resulting membrane was uniform, free of holes or breaks and was visually translucent. Membrane physical properties are listed in Table 1. The SEM of FIG. 3 depicts the product.

Example 4

Figure 4:
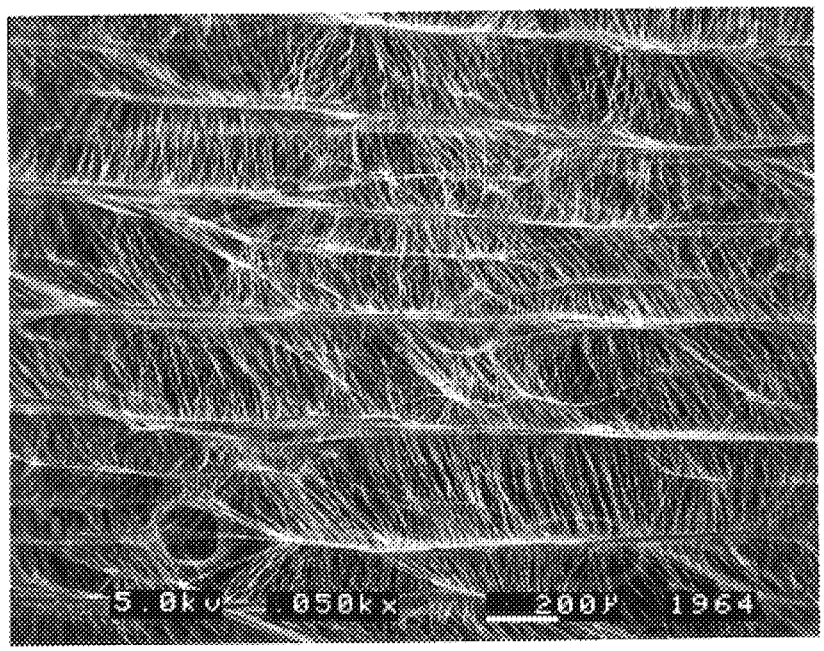
FIG. 4 depicts the product of the invention produced in Example 4.

The blended resin used in Example 1 was compounded with 23.37% aliphatic hydrocarbon and formed into a cylindrical pellet. The pellet was extruded through a rectangular orifice die to give a continuous tape 6 inches wide and 0.027 inch thick. The extruded tape was calendered between rollers to give a final thickness of 0.006 inch. The tape was thermally dried to remove the aliphatic hydrocarbon and then was expanded in the longitudinal direction a ratio of 6.25:1 at 300° C. The expanded tape was amorphously locked by contacting heated rolls at 370° C. The locked tape was stretched an additional ratio of 4:1 in the longitudinal direction at 375° C. at a line speed of 20 ft/min. The tape was then stretched in the transverse direction to a ratio of 6.58:1 at 375° C. and at a line speed of 32.8 ft/min. The resulting membrane was continuous and uniform. Membrane properties are given in Table 1. The SEM of FIG. 4 depicts the product.

Example 5

Figure 5:
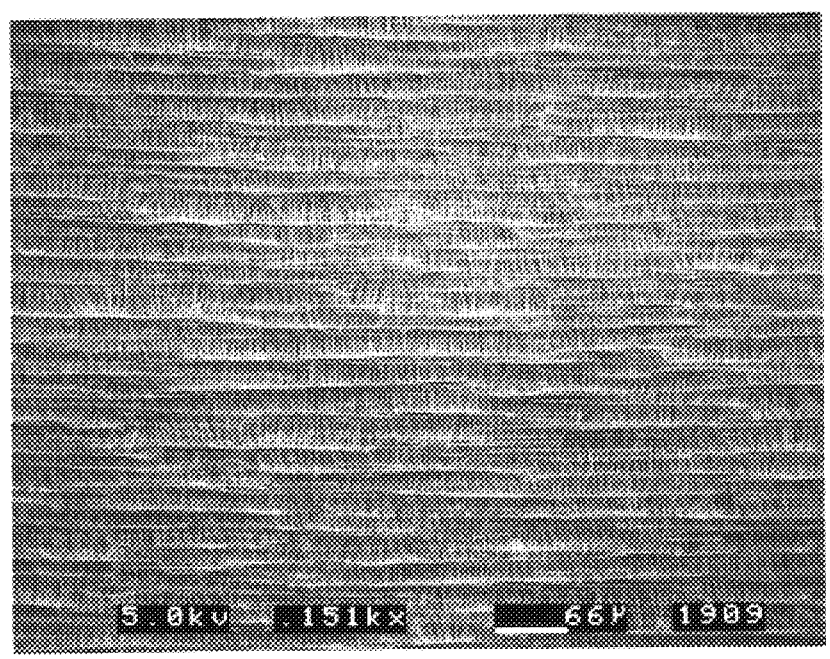
FIG. 5 depicts the product of the invention produced in Example 5.

A high molecular weight PTFE homopolymer (SSG= 2.158g/cc) was compounded with 21.7% aliphatic hydrocarbon and formed into a cylindrical pellet. The pellet was extruded through a rectangular orifice die to form a tape 6 inches wide and 0.027 inch thick. The tape was calendered between rolls to give a final thickness of 0.006 inch. The tape was thermally dried to remove lubricant and then was expanded in the longitudinal direction at 300° C. and a line speed of 10 ft/min to a total ratio of 5.06:1. the expanded tape was amorphously locked by contacting heated rolls at 370° C. The amorphously locked tape was stretched in the transverse direction to a ratio of 6.56:1 in a 375° heated chamber at a line speed of 32.8 ft/min. The resulting membrane was extremely uniform, very strong and free of holes or breaks. Membrane physical properties are listed in Table 1. The SEM of the product is shown in FIG. 5.

TABLE 1

MEMBRANE PROPERTIES FOR EXAMPLES 1 THROUGH 5

| Example | Frazier Air Flow* | Resistance (in. H₂O) | Ball Burst (lbs.) | Approximate Node Aspect Ratio | Strength × Air Flow Product Frazier × Ball Burst |
|---|---|---|---|---|---|
| 1 | 36 | 4.2 | 3.52 | 500 | 127 |
| 2 | 19 | 9.38 | 7.29 | 100 | 139 |
| 3 | 406** | 0.443 | 1.33 | 200 | 540 |
| 4 | 162** | 1.108 | 0.97 | 100 | 157 |
| 5 | 7.5 |  | 8.93 | 200 | 67 |

*cu. Ft./min./sq. ft. At 0.5 in. H₂O
**Calculated from resistance values

Example 6

A high molecular weight PTFE homopolymer (SSG= 2.158g/cc) was compounded with 21.7% aliphatic hydrocarbon and formed into a cylindrical pellet. The pellet was extruded through a rectangular orifice die to form a tape 6 inches wide and 0.027 inch thick. The tape was calendered between rolls to give a final thickness of 0.0105 inch. The tape was thermally dried to remove lubricant and then was expanded in the longitudinal direction at 300° C. and a line speed of 10 ft./min. to a total ratio of 9:1. The expanded tape was amorphously locked by contacting heated rolls at 370° C. The amorphously locked tape was stretched in the transverse direction a total ratio of 7:13:1 in a 375° C. heated chamber at a line speed of 32.8 ft./min. The resulting membrane was extremely uniform, very strong and free of holes or breaks.

Five sections of this membrane were taken along its length at roughly 15 ft. intervals. Each section was tested for air flow (Frazier Test), burst strength (Ball Burst Test) and mass per area in five locations equally spaced across the web. Measurements were taken at least two inches from the edges of the membrane to avoid edge effects. A total of twenty five measurements were taken for each property over a total length of membrane of approximately 100 ft. Averages and standard deviation (Std. Dev.) values were calculated. The percent coefficient of variability was then calculated for each property using the following equation.

$$\frac{\text{Standard Deviation}}{\text{Average}} \times 100 = \% \text{ Coefficient of Variability } (\% \ CV)$$

% coefficient of variability is used here as a measure of overall uniformity of the membrane with respect to the specific property measured. Average, standard deviation and % coefficient of variability for each of the three properties measured are listed below:

| Property | Average | Std. Dev. | % CV |
|---|---|---|---|
| Frazier Number (cu. ft./min. sq. Ft. Sample at 0.5 in. Water Pressure) | 3.124 | 0.1608 | 5.15 |
| Ball Burst (lbs.) | 9.54 | 0.9167 | 9.61 |
| Mass per Area (g/m2) | 7.584 | 0.2444 | 3.22 |

Example 7

Figure 6:
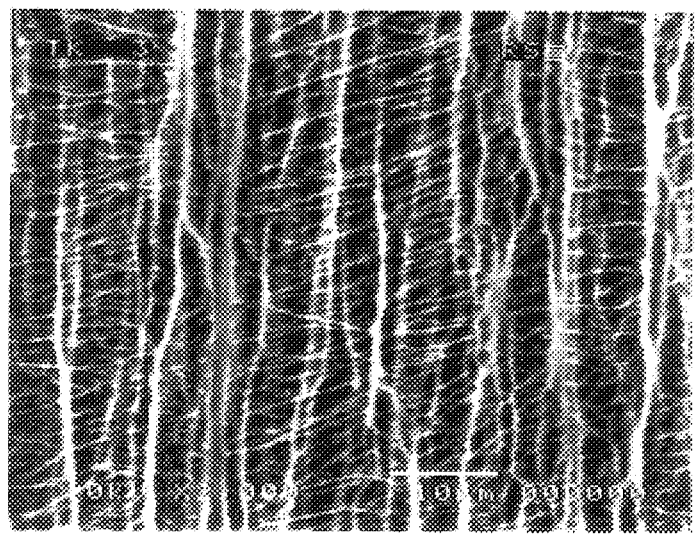
FIG. 6 depicts the product of the invention produced in Example 7.

A high molecular weight PTFE emulsion polymerisate (molecular weight >5×10$^6$) made in accordance with EP 170382 (12800g) was premixed with 820g PTFE micropowder MP 1200 made by radiation technique (available from E. I. DuPont de Nemours Co., Inc., of Wilmington, Del.) for 10 minutes. This resin blend was compounded with 4000 ml aliphatic hydrocarbon (boiling range 191° C.–212° C.). A cylindrical pellet was formed and extruded through a rectangular orifice die to form a tape approximately 160 mm wide and 660 μm (0.026 inch) thick. This tape was calendared between rolls to give a final thickness of 100 μm. The extruded, rolled down tape was thermally dried to remove lubricant and then expanded in the longitudinal direction 4:1 at 235° C. This expanded tape was amorphously locked by contacting 361° C. heated rolls. The tape was running at a line speed of 43 m/min. The amorphously locked tape was stretched in the transverse direction at a total ratio of 10.0:1 in a 355° C. heated chamber at a line speed of 20 m/min. Membrane bulk properties are given in Table 2. The SEM of FIG. 6 depicts the final product shown at magnifications of 2000×.

Example 8

Figure 7:
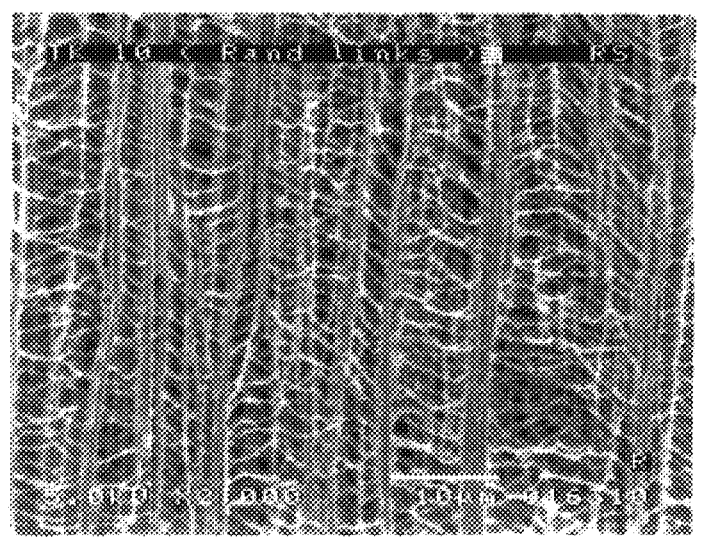
FIG. 7 depicts the product of the invention produced in Example 8.

A high molecular weight PTFE emulsion polymerisate (molecular weight>5×10$^6$) made in accordance with EP 170382 (6396g) was premixed with 408g PTFE micropowder TF 9202, made by polymerization and commercially available from Hoechst AG Gendorf 10 minutes. This resin blend was compounded with 2160 ml aliphatic hydrocarbon (boiling range 191° C.–212° C). A cylindrical pellet was formed and extruded through a rectangular orifice die to form a tape approximately 160 mm wide and 660 μm (0.026 inch) thick. This tape was calendered between rolls to give a final thickness of 95 μm. The extruded, rolled down tape was thermally dried to remove lubricant and then expanded in the longitudinal direction 3.98:1 at 230° C. This expanded tape was amorphously locked by contacting 361° C. heated rolls. The tape was running at a line speed of 43 m/min. The amorphously locked tape was stretched in the transverse direction at a total ratio of 10.0:1 in a 355° C. heated chamber at a line speed of 20 m/min. Membrane bulk properties are given in Table 2. The SEM of FIG. 7 depicts the final product, shown at magnifications of 2000×.

Example 9

Figure 8:
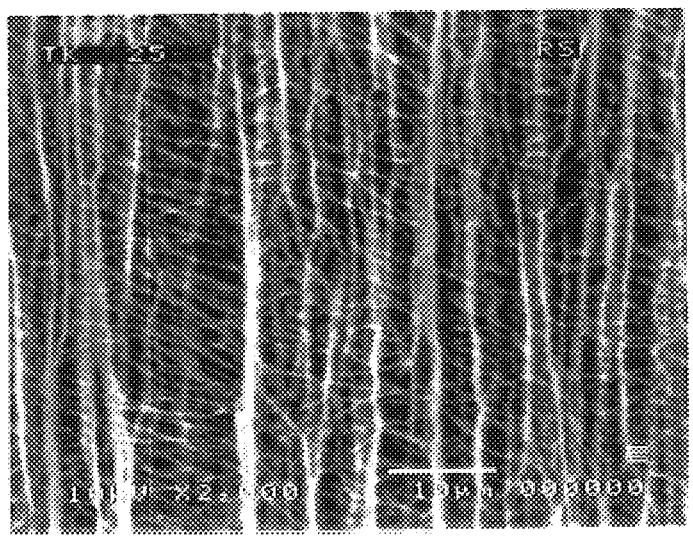
FIG. 8 depicts the product of the invention produced in Example 9.

A high molecular weight PTFE emulsion polymerisate (molecular weight >5×10$^6$) made in accordance with EP 170382 (6396g) was premixed with 408g PFA 532–5011 (available from E. I. DuPont de Nemours Co., Inc., of Wilmington, Del.) for 10 minutes. This resin blend was compounded with 2190 ml aliphatic hydrocarbon (boiling range 191° C.–212° C). A cylindrical pellet was formed and extruded through a rectangular orifice die to form a tape approximately 160 mm wide and 660 μm (0.026 inch) thick. This tape was calendered between rolls to give a final thickness of 95 μm. The extruded, calendered tape was thermally dried to remove lubricant and then expanded in the longitudinal direction 3.98:1 at 230° C. This expanded tape was amorphously locked by contacting 361° C. heated rolls. The tape was running at a line speed of 43 m/min. The amorphously locked tape was stretched in the transverse direction at a total ratio of 10.0:1 in a 355° C. heated chamber at a line speed of 20 m/min. Membrane bulk properties are given in Table 2. The SEM of FIG. 8 depicts the final product, shown at magnifications of 2000.

TABLE 2

MEMBRANE PROPERTIES FOR EXAMPLES 7 THROUGH 9

| | Thickness μm | Mean Flow Pore Size μm | MVTR* g/m$^2$/24 h | mTS-M** N/mm$^2$ | mTS-T*** N/mm$^2$ |
|---|---|---|---|---|---|
| 7 | 5 | 1.10 | 105000 | 97 | 155 |
| 8 | 3 | 1.10 | 90000 | 116 | 200 |
| 9 | 3 | 1.19 | 105000 | 131 | 182 |

*Moisture Vapor Transmission Rate
**Matrix Tensile Strength Machine Direction
***Matrix Tensile Strength Transverse Direction Example 10

4000 ml paraffin oil with a boiling point between 181° C. and 212° C. was introduced to a water-cooled mill. 12 g of lauric acid was then added quickly to this followed by 600 g of aluminum oxide added slowly (Al$_2$O$_3$) (Alpha UFX-MAR from the Chemag Co.). This dispersion was metered in a solids-liquid mixer (Patterson Kelly) into 11.4 kg of PTFE emulsion polymerizate present in it (molecular weight >5×10$^6$ produced according to EP-A-0170382) over a period of 10 minutes and was then mixed for another 10 minutes. A molding in the form of a pellet was produced from this mixture under vacuum at 10–15 bar.

A film (tape) was then formed by paste extrusion. This film was then calendered by means of heated rolls to the desired thickness (see Table 3). The lubricant was removed thermally. For this purpose the film was passed over heated rolls (240° C.–250° C.) after the calendering step. The film was then stretched in the machine direction, and then in the transverse direction, at 240° C.(200%/s) and sintered at temperatures greater than 330° C. This film was then stretched perpendicular to the machine direction (transverse) at a temperature above the crystalline melt point. The draw ratio was 10:1.

Example 11

The same procedure for Example 10 was followed to produce a filled tape that contained titanium oxide (R-320 from Hombitan) instead of 600 g aluminum oxide. This film was then stretched two-fold perpendicularly to the machine (transverse) direction at a temperature above the crystalline melt point. The draw ratio was 10:1 and for Example 11.2.4 (see Table 3), the draw ratio was 5:1.

TABLE 3

PROCESS CONDITIONS AND PROPERTIES OF PRODUCTS OF EXAMPLES 10 11, and COMPARATIVE EXAMPLE

| Film | | Thickness in μm | Draw Ratio | Speed[1] m/min. | First Melting Point °C. | mTS(T)[2] N/mm | mTS(M)[3] N/mm | MFP[4] μm |
|---|---|---|---|---|---|---|---|---|
| 5% Al$_2$O$_3$ | 10.1.1 | 50 | 10:1 | 15 | 333.3 | 80 | 52 | 0.8 |
| | 10.1.2 | 20 | 10:1 | 20 | 334.8 | 120 | 59 | 0.8 |
| | 10.1.3 | 8 | 10:1 | 20 | 341.1/335.6 | 171 | 75 | 1.5 |
| | 10.1.4 | 2–3 | 10:1 | 5 | 335.2 | 116 | 183 | 1.4 |
| 5% TiO$_2$ | 11.2.1 | 55 | 10:1 | 20 | 339.2/329.2 | 166 | 62 | 0.8 |
| | 11.2.2 | 16 | 10:1 | 20 | 336.4 | 68 | 152 | 0.5 |
| | 11.2.3 | 13 | 10:1 | 20 | 340.4 | 222 | 106 | 1.5 |
| | 11.2.4 | 5–6 | 5:1 | 20 | 337.2/331.7 | 86 | 259 | 1.5 |

[1]Machine Speed.
[2]Matrix tensile strength (transverse); matrix tensile strength in the direction transverse to the machine direction.
[3]Matrix tensile strength (tensile strength in the machine or transport direction).
[4]Mean Flow Pore Size.

Figure 9A:
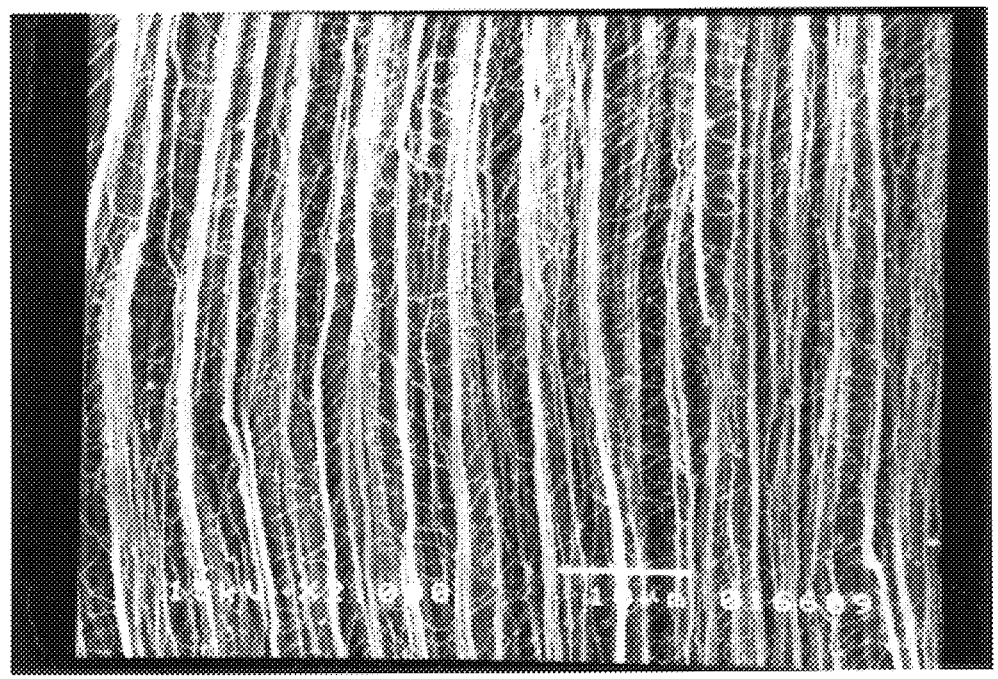
FIGS. 9a and 9b depict a product of the invention with 5 percent $Al_2O_3$ nanoparticles present as filler taken at 2000 and 3500 fold magnification.
Figure 9B:
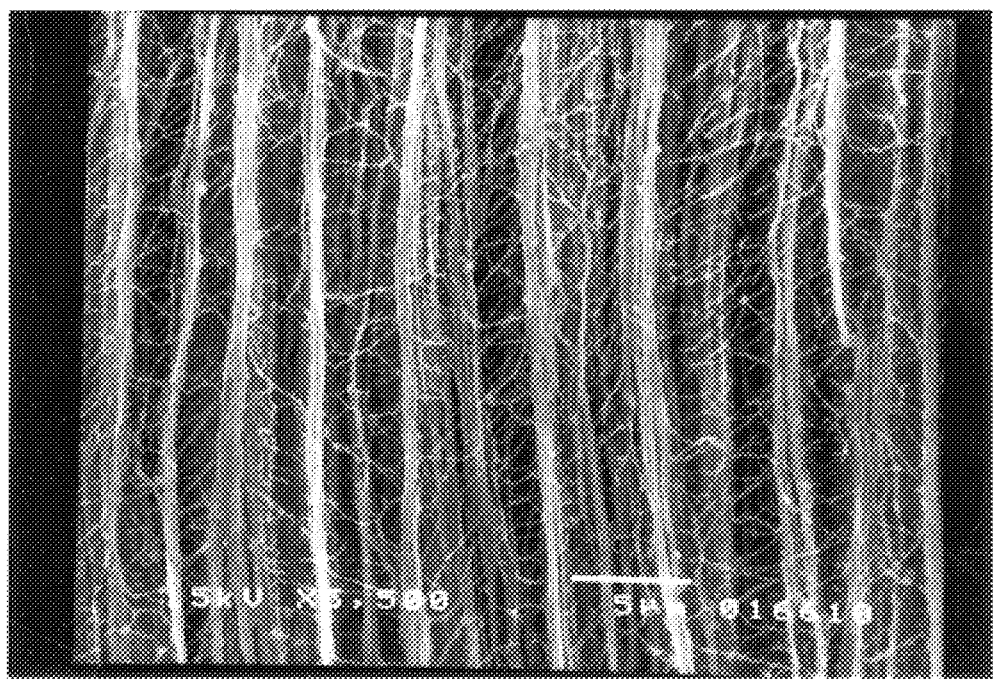

FIGS. 9A and 9B show ePTFE membranes of the invention at different magnification (200×and 3500×), but with a nanoparticle filler, namely 5% Al$_2$O$_3$, produced according to Example 10.

Figure 10A:
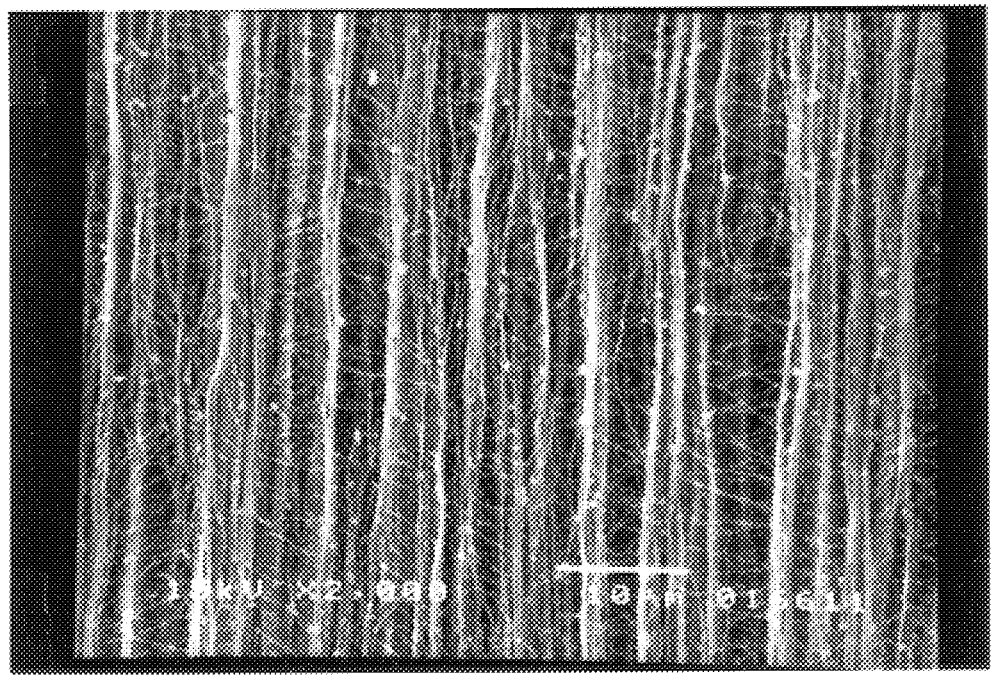
FIGS. 10a and 10b depict a product of the invention with 5 percent $TiO_2$ nanoparticles present as filler taken at 2000 and 3500 fold magnification.
Figure 10B:
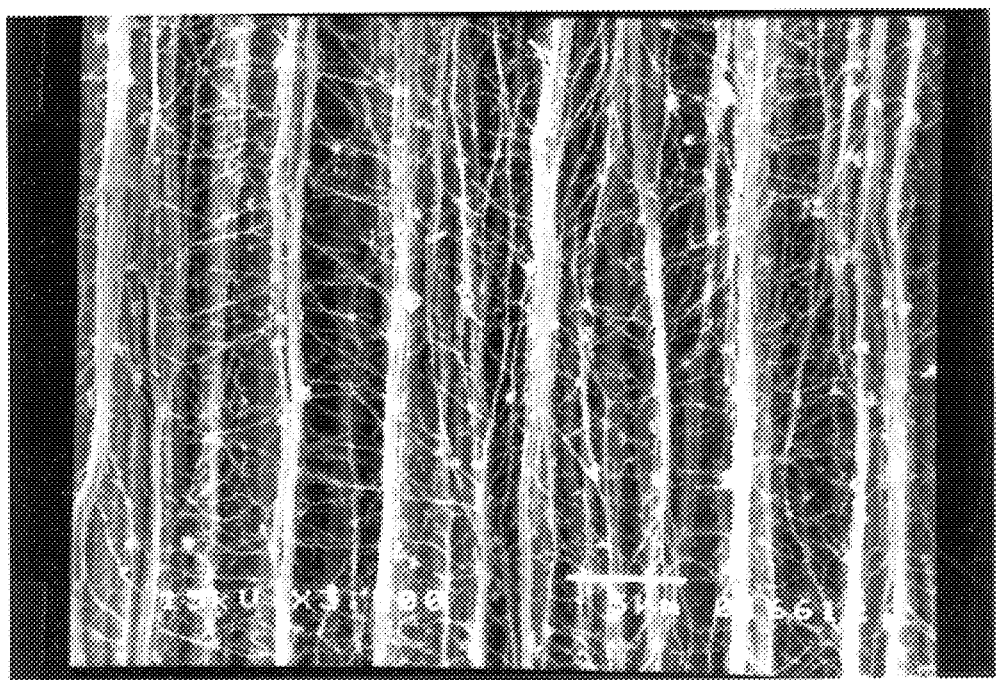

The same is true for the structure of the ePTFE membrane depicted in FIGS. 10A and 10B in which the nanoparticle filler consists of 5% TiO$_2$.

We claim:

1. A microporous polytetrafluoroethylene article having an internal microstructure consisting essentially of a series of nodes interconnected by fibrils, said nodes generally aligned in parallel, being highly elongated and having an aspect ratio of 25:1 or greater.

2. The microporous polytetrafluoroethylene article of claim 1 wherein the node aspect ratio is 50:1 or greater.

3. The microporous polytetrafluoroethylene article of claim 1 wherein the article has Frazier Number air flow and Ball Burst strength values such that the product of Frazier Number (cubic ft/min/square feet of sample/0.5 inches of H$_2$O pressure) and Ball Burst (pounds) is equal to or greater than 60.

4. The microporous polytetrafluoroethylene article of claim 1 wherein the article has Frazier Number air flow and Ball Burst strength values such that the product of Frazier Number (cubic ft/min/square feet of sample/0.5 inches of H$_2$O pressure) and Ball Burst (pounds) is equal to or greater than 100.

5. A microporous polytetrafluoroethylene article of claim 1 wherein the aspect ratio of the nodes is greater than 150.

6. The article of claim 1 in which the polytetrafluoroethylene resin is a blend of dissimilar polytetrafluoroethylene polymers.

7. The article of claim 1 in which the polytetrafluoroethylene resin is a blend of a polytetrafluoroethylene homopolymer and a modified polytetrafluoroethylene polymer.

8. A microporous polytetrafluoroethylene article of claim 1 in the shape of a membrane or a tube.

9. A microporous polytetrafluoroethylene article of claim 8 which is asymetric wherein the node-fibril microstructures on the two surfaces of the membrane or tube is different.

10. The polytetrafluoroethylene article of claim 1 which contains filler.

11. The polytetrafluoroethylene article of claim 1 which contains filler particles of an average size from 5 to 500 nm.

12. The polytetrafluoroethylene article of claim 1 which contains a filler chosen from inorganic fillers.

13. The polytetrafluoroethylene article of claim 11 which contains inorganic fillers.

14. A microporous polytetrafluoroethylene article having a microstructure consisting essentially of a series of nodes interconnected by fibrils, said nodes generally aligned in parallel and having Frazier Number air flow and Ball Burst strength values such that the product of Frazier Number (cubic ft/min/square feet of sample/0.5 inches of H$_2$O pressure) and Ball Burst (pounds) is equal to or greater than 139.

15. The microporous polytetrafluoroethylene article of claim 14 wherein the article has Frazier Number air flow and Ball Burst strength values such that the product of Frazier Number (cubic ft/min/square feet of sample/0.5 inches of H$_2$O pressure) and Ball Burst (pounds) is equal to or greater than 157.

16. A process for preparing a porous polytetrafluoroethylene article which comprises the steps in sequence of.

(a) lubricating and paste extruding at least one polytetrafluoroethylene fine powder resin to provide a tape extrudate;

(b) removing lubricant;

(c) stretching the extrudate at least uniaxially at a temperature below the crystalline melting point the lowest melting polytetrafluoroethylene component;

(d) amorphously locking the stretched tape by raising the temperature of the tape to above the crystalline melting point of the highest melting polytetrafluoroethylene component;

(e) stretching at a temperature above the crystalline melting point of the highest melting polytetrafluoroethylene component, in at least the direction orthogonal to the direction of greatest original stretch.

* * * * *